(12) United States Patent
Molnar

(10) Patent No.: US 6,298,227 B1
(45) Date of Patent: Oct. 2, 2001

(54) METHOD AND APPARATUS FOR FREQUENCY CONVERSION FOR A RECEIVER WITH A LIMITED-ACCURACY OSCILLATOR

(75) Inventor: Karl J. Molnar, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/219,327

(22) Filed: Dec. 22, 1998

(51) Int. Cl.$^7$ .................................................... H04B 1/26
(52) U.S. Cl. ........................................ 455/323; 455/226.1
(58) Field of Search .................................... 455/313, 323, 455/67.1, 226.1; 375/227

(56) References Cited

U.S. PATENT DOCUMENTS

| 5,796,777 | * | 8/1998 | Terlep et al. .......................... 375/227 |
| 5,859,842 | * | 1/1999 | Scott ..................................... 370/342 |
| 6,128,469 | * | 10/2000 | Zenick, Jr. et al. ................. 455/12.1 |

OTHER PUBLICATIONS

J. Ahmad et al., "DSP Based Carrier Recovery Techniques for OQPSK Mobile Satellite Communications," *Signal Processing VI: Theories and Applications*, 1992 Elsevier Science Publishers B.V., pp. 1677–1680.

J. Ahmad et al., "Digital Frequency Error Detectors for OQPSK Satellite Modems," *Electronics Letters*, Sep. 26, 1991, vol. 27, No. 20, pp. 1821–1823.

S. Holm, "Optimum FFT–Based Frequency Acquisition with Application to COSPAS–SARSAT," *IEEE Transactions on Aerospace and Electronic Systems*, vol. 29, No. 2, Apr. 1993, pp. 464–475.

* cited by examiner

*Primary Examiner*—William Trost
*Assistant Examiner*—Rafael Perez-Gutierrez
(74) *Attorney, Agent, or Firm*—Coats & Bennett

(57) ABSTRACT

A frequency converter that converts a signal at a radio frequency to an intermediate frequency using a limited-accuracy local oscillator. The frequency converter is configured to receive an analog signal at a first frequency and convert the analog signal to an intermediate frequency using the local oscillator. The frequency converter also includes an analog-to-digital converter to convert the intermediate frequency signal to a digital representation of the signal, and a plurality of digital filters, each configured to filter the digital representation of the signal by a frequency offset, each digital filter using a different frequency offset. There are also a plurality of correlators equal in number to the plurality of digital filters and each configured to generate a correlation of the filtered digital representation of the signal to known synchronization words shifted by the frequency offset of its respective digital filter. A selector is configured to derive a final frequency offset from the plurality of correlation results as a correction factor for the baseband signal.

30 Claims, 4 Drawing Sheets

METHOD AND APPARATUS FOR FREQUENCY CONVERSION FOR A RECEIVER WITH A LIMITED-ACCURACY OSCILLATOR

FIELD OF THE INVENTION

This invention relates to the field of wireless communication systems, and more particularly, to a signal downconverter that can compensate for a limited-accuracy oscillator.

BACKGROUND OF THE INVENTION

Almost all radio systems receive a signal at one frequency and then convert the signal to an intermediate or baseband frequency. The radio system then demodulates the signal on the intermediate (baseband) frequency. Such radio systems require this step so that they can receive signals on a range of frequencies, but only need to demodulate the signal on one (intermediate) frequency, rather than having to demodulate the signal on each of the frequencies in the range. To convert the signal, a locally-generated intermediate frequency signal is mixed with the incoming radio frequency signal and then the resultant signal is filtered to remove all frequencies except for the signal on the intermediate frequency. This signal is then demodulated. A crystal oscillator in the receiver generates this intermediate frequency. When a complex signal that requires precise demodulation is received (such as those in wireless transceivers), the frequency reference must be very accurate so that the demodulator can recover the content cleanly.

A transceiver in current mobile stations requires a very precise intermediate frequency oscillator in order to provide a frequency reference that does not add distortion to the signal. Hence, mobile stations employ expensive, temperature-compensated crystal oscillators. There is a trade-off between the expense of precise oscillators and the degree of distortion that may be acceptable.

The present invention is directed toward overcoming one or more of the problems set forth above.

SUMMARY OF THE INVENTION

According to one aspect of this invention, a frequency converter is disclosed that compensates for a limited-accuracy local oscillator that generates an intermediate (baseband) frequency. The frequency correction device includes a frequency converter configured to receive an analog signal at a first frequency and convert the analog signal to an intermediate frequency using the intermediate frequency. An analog-to-digital converter converts the intermediate frequency signal to a digital representation of the signal. The frequency correction device also includes a plurality of digital filters, each configured to filter the digital representation of the signal at a predefined frequency offset, each digital filter filtering at a different frequency offset. There are also a plurality of correlators (advantageously equal in number to the plurality of digital filters), each configured to generate a correlation of the filtered digital representation of the signal to known synchronization words, each word having been previously shifted by the frequency offset of the correlator's respective digital filter. A selector derives a final frequency offset for use in correcting the intermediate frequency of the signal to remove any distortion introduced by the limited-accuracy oscillator.

In accordance with another aspect of this invention, the selector is configured to derive the final frequency offset by finding the highest correlation, by averaging the correlation results, by taking a weighted average of the correlation results or by averaging all of the correlation results with previous correlation results.

In accordance with another aspect of this invention, the number of filters and correlators vary with the desired accuracy of the frequency control device. Further, the filters and/or correlators may operate in parallel or in series.

In accordance with another aspect of this invention, a frequency converter is described that generates a frequency offset to compensate for a limited-accuracy oscillator. The frequency correction device comprises a limited-accuracy local oscillator generating an intermediate frequency, a summer for summing the frequency offset with the intermediate frequency from the local oscillator and a frequency converter configured to receive an analog signal at a first frequency and convert the signal to an intermediate frequency using the summed intermediate frequency. An analog-to-digital converter converts the signal to a digital representation of the signal. A plurality of digital filters are configured to filter the digital representation of the signal at assigned frequency offsets. There are also a plurality of correlators that are configured to receive filtered digital representation of the signal from the plurality of filters and configured to generate a correlation of the filtered digital representation of the signal to known synchronization words shifted by an assigned frequency offset. A selector derives a final frequency offset from a plurality of correlation results and delivers the final frequency offset to the summer.

In accordance with yet another aspect of this invention, the summer is configured to sum the oscillator's reference frequency with a portion of the final frequency offset.

In accordance with yet another embodiment of this invention, a method is described for deriving a frequency offset to correct an intermediate frequency signal for frequency errors introduced in the down-conversion by a limited-accuracy oscillator. The method comprises the steps of converting a signal received at a first frequency to a second frequency using the limited accuracy oscillator, filtering adjacent and other signals from the signal and converting the filtered signal to digital symbols. The method further includes the steps of filtering the digital symbols by plurality of frequency offsets, correlating the filtered digital symbols with a plurality of digital representations of synchronization words to generate a correlation and selecting one of the correlations as the frequency offset for decoding the signal.

In accordance with another aspect of this invention, the step of filtering occurs simultaneously for all filters or the step could occur for each filter serially. Finally, the step of synchronizing could occur simultaneously for all correlators or for each correlator serially.

BRIEF DESCRIPTION OF THE DRAWINGS

A more complete understanding of this invention may be obtained from a consideration of the following detailed description in conjunction with the drawings, in which.

DETAILED DESCRIPTION

A cost savings may be realized in mobile stations in size, space and cost of circuitry by converting the RF signal to an IF signal using a signal from a less precise oscillator than is currently used in mobile stations and then correcting the IF signal for error introduced by the limited-accuracy oscillator. This invention provides a system and method for down-converting the analog signal using a limited-accuracy local oscillator, filtering the analog signal with a limited-accuracy intermediate filter, and then converting the analog signal into digital form. According to this invention, a plurality of digital filters are connected to a plurality of correlators, wherein each filter filters the digital representation of the signal using one of a plurality of frequency offsets and then the correlator correlates the received signal to known synchronization words (shifted by the same frequency offset as its respective filter) in the received signal. A selector then selects among the various correlation results, or, alternatively, may average or use a weighted average to determine a final frequency offset. This frequency offset is used to align the baseband signal for demodulation.

Figure 1:
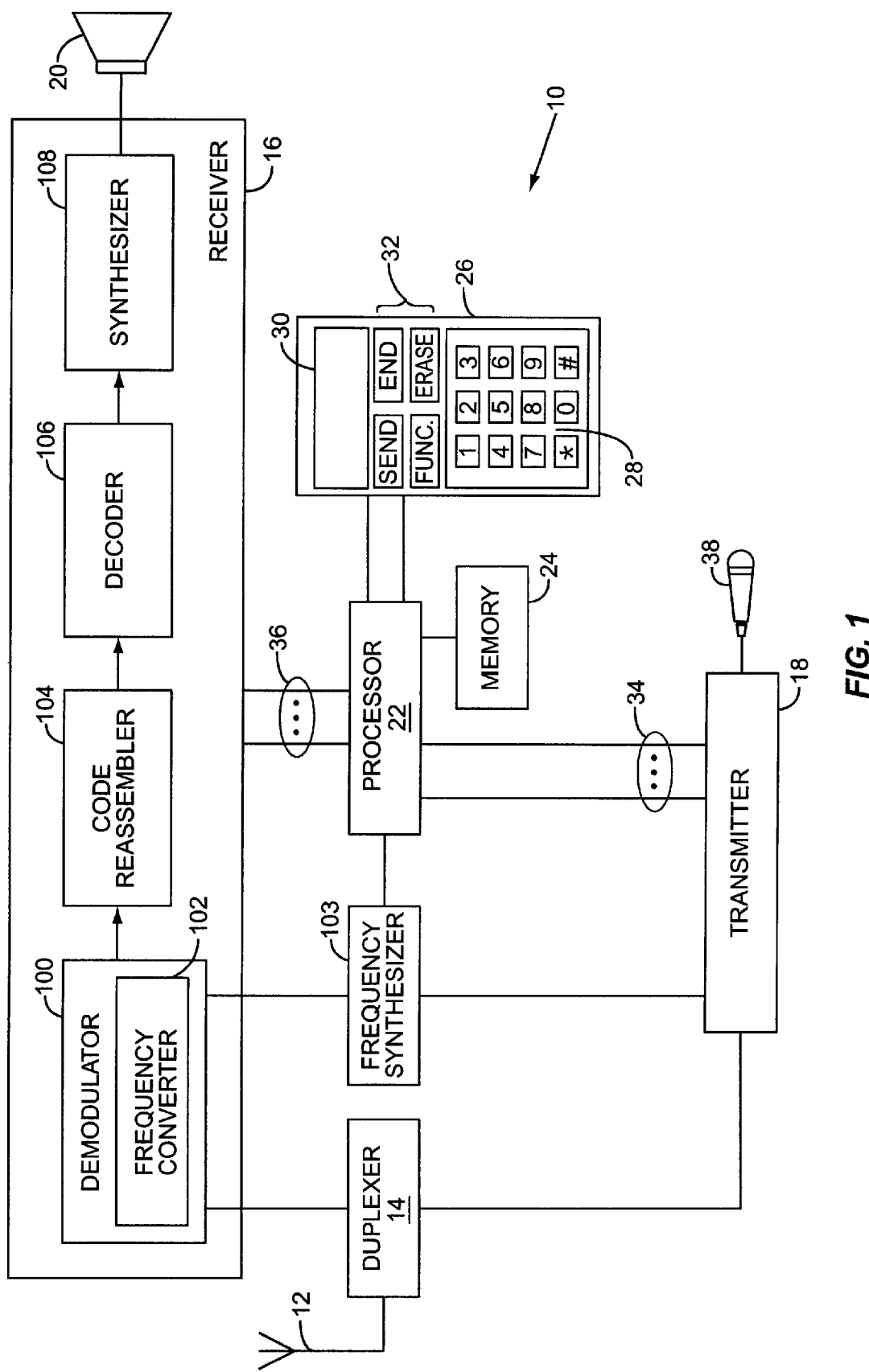
FIG. 1 is a block diagram of a wireless mobile station in which this invention may be practiced.

FIG. 1 is a block diagram of a mobile station (also called a wireless telephone, cellular telephone or cell phone), shown generally at 10. Mobile station 10 includes an antenna 12 for sending and receiving radio frequency (RF) signals between itself and a wireless network. Antenna 12 is connected to a duplexer 14 which enables receiver 16 and transmitter 18 to receive and transmit (respectively) on the same antenna 12. Receiver 16 demodulates, demultiplexes and decodes the radio signals into a control channel for control messages and a traffic channel for speech or data. Speech is delivered to speaker 20. Receiver 16 delivers messages from the control channel to processor 22.

Processor 22 controls and coordinates the functionality of mobile station 10 responsive to messages on the control channel using programs and data stored in memory 24. Processor 22 also controls the operation of mobile station 10 responsive to input from the user interface 26. The user interface 26 includes a keypad 28 as a user input device and a display 30 to convey information to the user. Other devices are frequently included in user interface 26 such as lights and special purpose buttons 32. Processor 22 controls the operation of transmitter 18 and receiver 16 over control lines 34 and 36, respectively, responsive to control messages and user input.

Microphone 38 receives speech signal input, converts the input into analog electrical signals and delivers the analog electrical signals to transmitter 18. Transmitter 18 converts the analog electrical signals into digital data, encodes the data with error detection and correction information and multiplexes this data with control messages from processor 22. Transmitter 18 modulates this combined data stream and transmits the results into radio signals to the wireless network through duplexer 14 and antenna 12.

According to the exemplary embodiment of this invention, receiver 16 includes a demodulator 100 which demodulates the radio signal into symbols using a frequency converter 102, in accordance with one aspect of this invention, that receives an intermediate frequency from local oscillator 103. The decoded symbols are delivered to a code reassembler 104 that is advantageous in systems that interleave encoded data as a hedge against fading in the transmission. The global system for mobile communication (GSM) standard, for example, specifies such interleaving. Code reassembler 104 takes interleaved characters and reassembles them in their proper order. The output of code reassembler 104 is delivered to a decoder 106.

The decoder 106 decodes the received symbols and passes the corresponding information symbols to their destination, as is known in the art. Received groups of symbols (words) that are determined to be control messages are delivered to the processor 22. Received words that are voice traffic are delivered to synthesizer 108, which uses the words to synthesize speech or other sound. The synthesized sound is delivered to speaker 20. Of course, if mobile station 10 is being used as a data modem, the information symbols are delivered directly from the decoder to a data output, not shown, but well known in the art.

Figure 2:
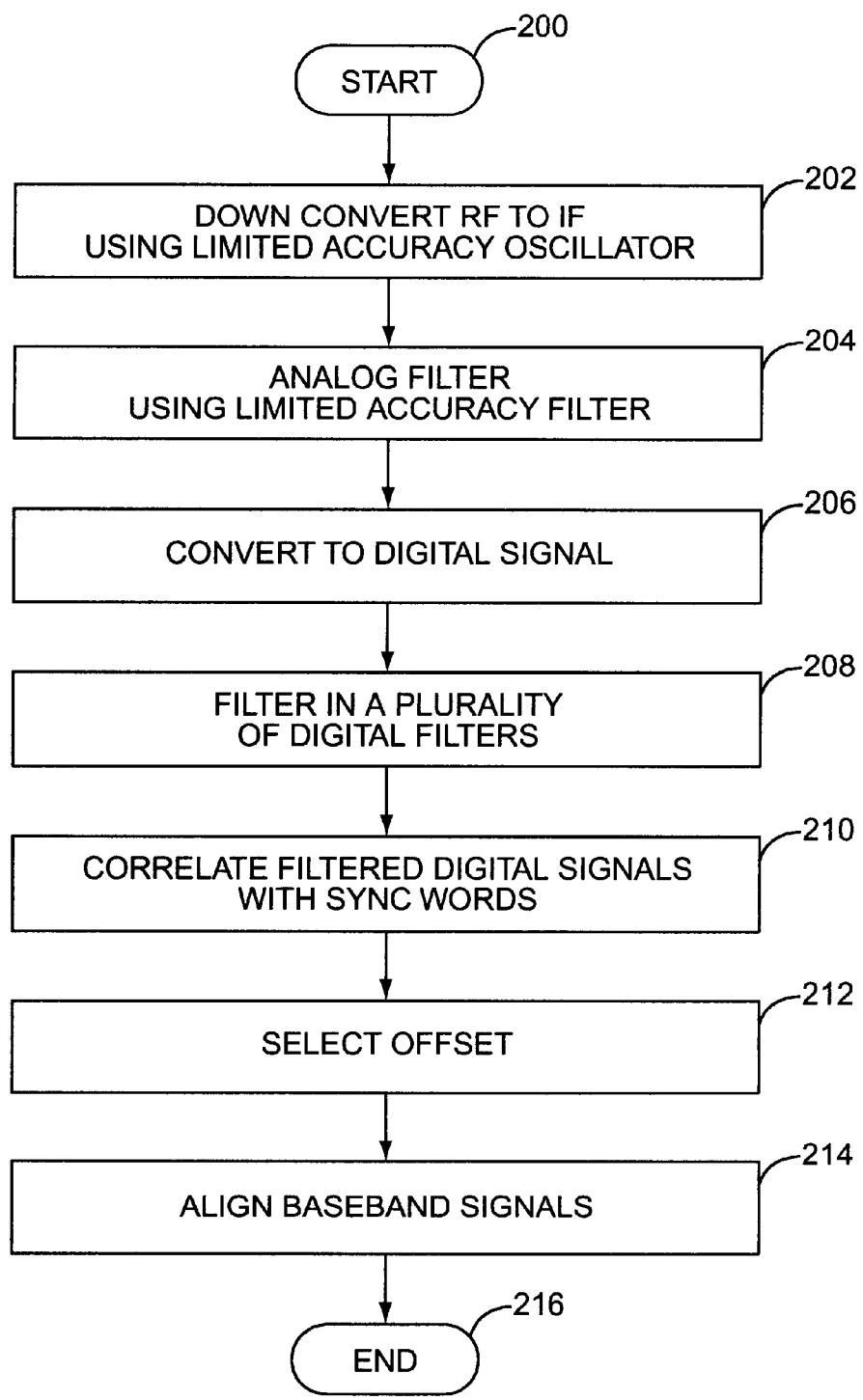
FIG. 2 is a flow chart of operation according to a method aspect of this invention as practiced in the wireless station of FIG. 1.

Turning now to FIG. 2, a flow chart of processing according to one aspect of this invention is shown. Processing starts in circle 200 and moves to action box 202 where an analog signal is received from duplexer 14. The analog signal is down-converted from the radio (transmission) frequency to an intermediate frequency (IF) by mixing the radio frequency with a reference frequency generated by a limited-accuracy oscillator. According to this exemplary embodiment, local oscillator 103 is a limited-accuracy oscillator. In the prior art, it is important to convert the radio frequency signal to the IF signal precisely. A less accurate oscillator adds frequency error, making demodulation more difficult, if not impossible.

However, according to this invention, the limited-accuracy nature of the oscillator is compensated-for prior to demodulation. Processing continues to box 204 where the IF signal is filtered using an analog filter, again with limited accuracy. In this context, a "limited-accuracy filter" is a band pass filter that has larger band pass bandwidth than filters used with high-accuracy oscillators. Undesired signals are filtered out, but the filter's wider bandwidth allows for any frequency error introduced by the limited-accuracy oscillator in the down conversion.

Processing continues to box 206 where the analog IF signal is converted to a digital representation of the analog IF signal (known in the art as analog-to-digital or A/D conversion). Processing then continues to box 208 where the digital signal is filtered in a plurality of digital filters. Each digital filter passes only the portion of the digital signal that is within a specific frequency band offset (a frequency that is a predetermined number of Hertz above or below the baseband frequency). Advantageously, the frequency offset is selected so that the range of possible frequency deviations introduced by down-converting with a limited-accuracy reference frequency is covered.

Processing continues to box 210 where the filtered digital signals are correlated with a known, pre-shifted synchronization word. Each synchronization word is shifted in frequency to match the frequency offset of the corresponding digital filter. Each correlator calculates a value that represents the degree to which the synchronization word in the filtered digital signal matches the model synchronization word. Thus, if there is a high correlation, the frequency offset of the digital filter/correlator is equivalent to the error introduced by the limited-accuracy reference frequence.

Processing continues to box 212 where the frequency offset with the highest correlation is selected. Processing continues to box 214 where the digital signal is aligned with the desired IF (baseband frequency) by shifting the digital signal by the selected frequency offset. Processing ends in circle 216.

Figure 3:
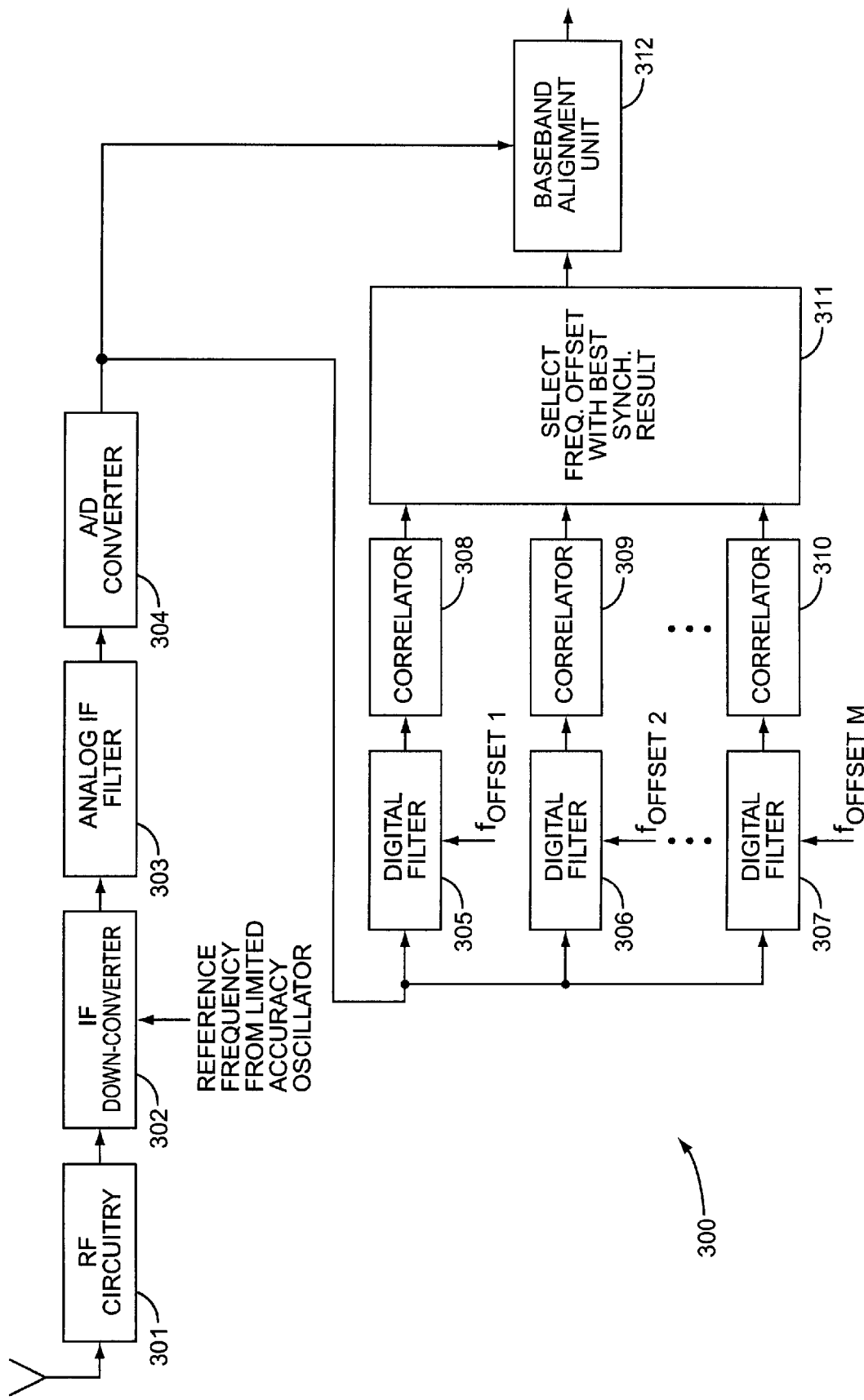
FIG. 3 is a block diagram of a frequency correction apparatus according to this invention in the context of the demodulator of FIG. 1.

Turning now to FIG. 3, a first exemplary embodiment of an automatic frequency correction unit according to another aspect of this invention is shown in block diagram 300. Radio frequency (RF) circuitry 301 processes the radio signal received at the antenna and converts it to an analog electrical signal. The analog signal is mixed with an intermediate frequency (IF) in IF down-converter 302 using the IF generated by the limited-accuracy oscillator (which adds some frequency error to the received signal). The output of IF down-converter 302 is filtered by an IF filter 303. The IF filter 303 has a band pass bandwidth wide enough for the desired signal at the IF and a predetermined maximum frequency shift (i.e., the frequency error introduced by the limited-accuracy frequency reference). IF down-converter may be a plurality (chain) of down-converters, each converting the analog signal in a step-wise fashion from the radio frequency to the intermediate frequency. Each stage requires a reference frequency, which, in this exemplary embodiment, adds a frequency error to the signal.

An analog-to-digital (A/D) converter 304 converts the filtered analog signal to a digital signal by sampling the analog signal at a time rate that will handle the largest expected frequency offset (error) and deriving a numerical representation of the analog signal. The output of the A/D converter is fed into a plurality of digital filters, represented by digital filters 305–307. Each digital filter 305–307 has a frequency offset input, offset 1–offset M. These offsets adjust the digital filter above or below the intermediate baseband frequency.

Advantageously, in a first or "coarse" acquisition mode, such as a frequency search or acquisition mode, where the expected input bandwidth may be large, there may be M digital filters to cover the large range of frequencies that the receiver is to search over. In a second or "fine" acquisition mode, such as a maintenance or tracking mode, the number of filters may be small to cover only the bandwidth of the expected frequency drifts. In this case there may be N digital filters wherein N<M. In the case of a non-varying frequency offset, only one filter would be used.

Each of the outputs from digital filters 305–307 is used as input to a correlator 308–310. Each correlator compares the filtered digital signal to known synchronization words. Each correlator 308–310 uses a representation of the synchronization words shifted by the same frequency offset as its associated digital filter. The closer that the frequency offset of the signal is to the frequency offset of the filter/correlator pair, the higher the correlation.

Selector 311 selects the best correlation and passes the frequency offset used to derive the best correlation to baseband alignment unit 312. Baseband alignment unit 312 down-converts the selected signal from selector 311 to baseband, accounting for the frequency offset.

Alternatively, the selector 311 may take the correlations and average them. The selector 311 then derives the frequency offset that corresponds to the average correlation. Additionally, the average may be weighted, i.e., the correlations from certain frequency offsets are multiplied by a weighting factor before the correlations are averaged. In this manner, the selector 311 may be biased toward certain frequency offsets, if desired. Further, other forms of interpolation may be used, such as quadratic interpolation, rather than the linear interpolation described in the exemplary embodiment.

Additionally, the digital filters 305, 306, 307 are selected so that the convolution of the IF filter and the digital filters (i.e., the overall filter response), when applied to the received signal yields a substantially Nyquist response shifted by the appropriate frequency offset. In other words, the response of the IF 303 and digital 305,306,307 are closer to the transmit filter than the prior art IF filter. Thus, better signal quality may be obtained from the principals of this invention.

Figure 4:
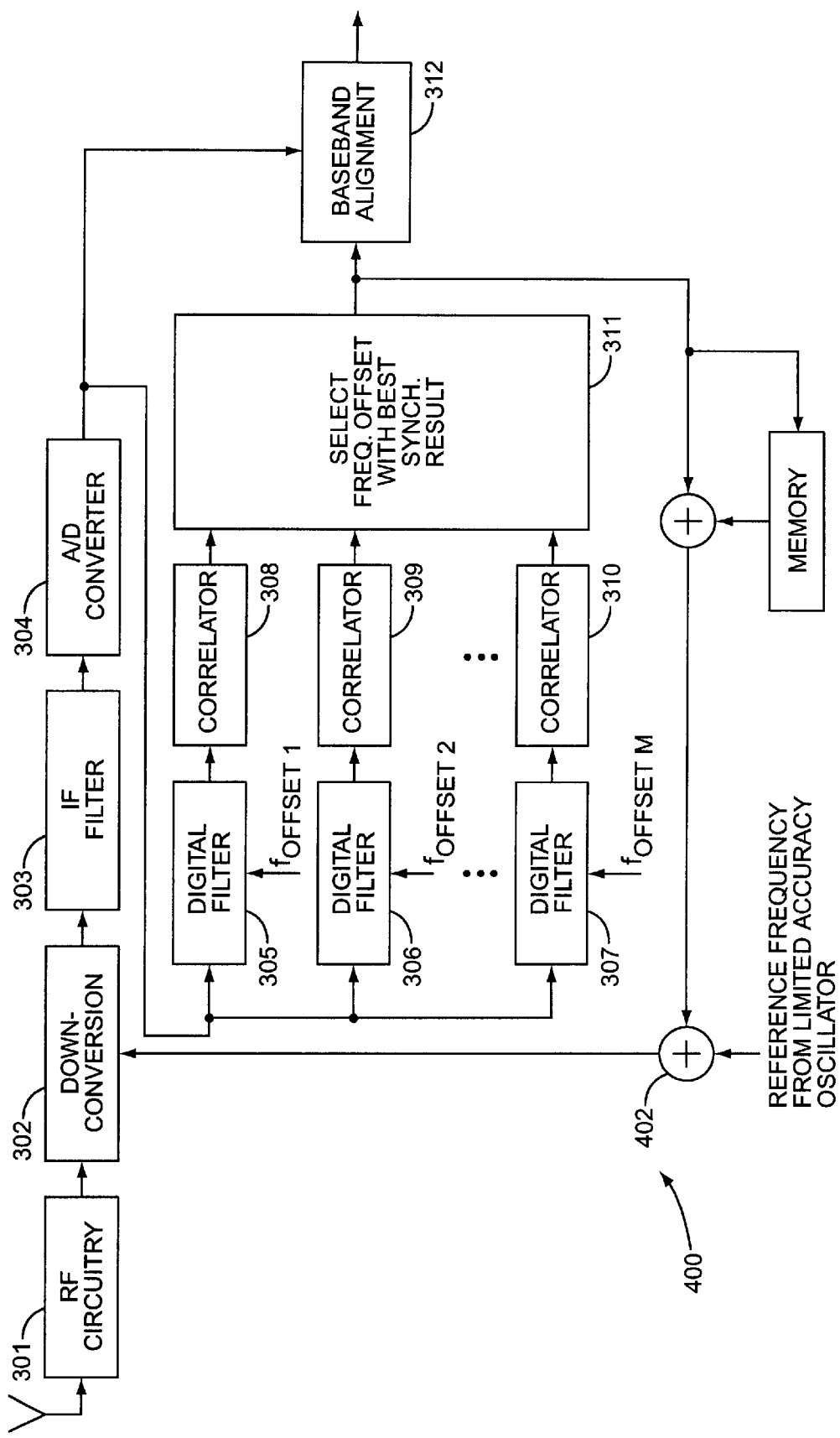
FIG. 4 is a further exemplary embodiment of this invention in the context of the demodulator of FIG. 1.

FIG. 4 illustrates another exemplary embodiment of this invention. This invention incorporates all the blocks of the previous FIG. 3 and adds a frequency adjustment feedback loop 400. As stated above, the selected frequency offset represents the frequency error introduced by the limited-accuracy oscillator in the down-conversion process. Feed back loop 400 corrects some of this error. In one aspect, the frequency offset determined by selector 311 may be delivered directly to an adder 402. Adder 402 adds the frequency offset delivered by selector 311 to the intermediate frequency in order to remove the frequency error found in the previous iteration. Additionally, the frequency offset may also be stored in memory 404 and one (or more) previous frequency offsets may be added at adder 406 to produce an average frequency offset, which is then added at adder 402 to the reference frequency.

According to this invention, a mobile station may use a lower cost oscillator and IF filter, but still maintain a quality signal. This invention provides a plurality of digital filters, each filtering a different frequency offset. The synchronization word in the filtered signal is then correlated against the known synchronization words and an offset is selected by one of the number of appropriate manners. Further, the digit filters and IF filter may be selected so that their convolution yield a substantially Nyquist response. In this fashion, a cheaper, energy efficient mobile station may be realized.

It is to be understood that the above described embodiments are exemplary of this invention. For example, the digital filters 305–307 and/or the synchronizers 308–310 may be in series rather than in parallel. Additionally, all of the operations of the digital filter and/or correlators may be performed in memory. Furthermore, the frequency converter described above is discussed in the context of a wireless telephone. This invention, of course, may be used in any receiver.

It is to be understood that one skilled in the art may devise many different variations and that the scope of this invention is only limited by the following claims.

What is claimed is:

1. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter;

a selector configured to select one of the plurality of correlations and use the frequency offset of the correlator that generated the selected correlation to correct the digital representation of the intermediate frequency signal; and a memory storing previous correlations wherein the selector is configured to derive the final frequency offset by averaging the plurality of correlations and averaging the correlations with previous correlations to determine a frequency offset that corresponds to the average correlation.

2. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal, wherein the selector is configured to derive the final frequency offset by averaging the weighted plurality of correlation results and the weighted average of previous correlations.

3. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset, said filters including a limited-accuracy intermediate filter configured to filter the signal on the intermediate frequency prior to analog-to-digital conversion, wherein the intermediate filter of the plurality of digital filters is selected to yield a substantially Nyquist response;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal.

4. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal;

wherein the frequency converter device operates in a first mode and a second mode, wherein the number of the plurality of digital filters is greater in the first mode than in the second.

5. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal, wherein the selector is configured to derive the final frequency offset by averaging the plurality of correlations and determining a frequency offset that corresponds to the average of the correlations.

6. The frequency converter device of claim 5, wherein the average of the plurality of correlations is a weighted average of the plurality of correlations and the selector determines the frequency offset that corresponds to the weighted average of the plurality of correlations.

7. The frequency converter device of claim 5, further including a limited-accuracy intermediate filter configured to filter the signal on the intermediate frequency prior to analog-to-digital conversion.

8. The frequency converter device of claim 5, wherein the number of the plurality of filters varies in inverse proportion to the accuracy of the frequency converter device.

9. The frequency converter device of claim 5, wherein the plurality of correlators are equal in number to the plurality of digital filters.

10. The frequency converter device of claim 5, wherein the plurality of filters operate in parallel.

11. The frequency converter device of claim 5, wherein the correlators operate in parallel.

12. A frequency converter for use in a communications receiver that converts a radio frequency signal to a baseband frequency signal, said frequency converter comprising:

a limited-accuracy local oscillator generating an intermediate frequency;

a summer configured to generate a summed reference frequency by combining the previous frequency offset with the reference frequency from the local oscillator;

a mixer configured to receive the radio frequency signal and convert the radio frequency signal to an intermediate frequency using the summed reference frequency;

an analog-to-digital converter configured to convert the intermediate frequency signal to a digital representation of the signal;

a plurality of digital filters, each configured to receive the digital representation of the signal and filter the digital representation of the signal by a frequency offset, each digital filter using a different frequency offset;

a plurality of correlators, each configured to:
 (a) receive a filtered digital representation of said signal from said plurality of digital filters; and
 (b) generate a correlation of said filtered digital representation of said signal to known synchronization words shifted by the frequency offset of its respective digital filter; and a selector configured to select one of the frequency offsets from the plurality of correlations, subtract the selected frequency offset from the signal at the intermediate frequency to provide the baseband frequency signal and deliver the selected frequency offset to the summer.

13. The frequency converter device of claim 12, further including a limited-accuracy intermediate filter configured to filter the analog signal prior to conversion in the analog-to-digital converter.

14. The frequency converter device of claim 12, wherein the summer is configured to sum the oscillator's reference frequency with a predetermined percentage of the previous frequency offset.

15. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal, the selector being configured to derive the final frequency offset non-linearly.

16. The frequency converter device of claim 15, wherein the selector is configured to derive the final frequency offset quadratically.

17. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters, each configured to receive the digital representation of the intermediate frequency signal and filter the digital representation of the signal at a frequency offset, each digital filter using a different frequency offset;

a plurality of correlators which operate in series, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal.

18. A frequency converter for converting a radio frequency signal to an intermediate frequency signal, said frequency converter comprising:

a limited-accuracy local oscillator configured to generate an intermediate frequency;

a mixer configured to receive the signal at a first frequency and the intermediate frequency from the limited-accuracy local oscillator and convert the signal to the intermediate frequency;

an analog-to-digital converter configured to convert the intermediate frequency signal to a digital representation of the intermediate frequency signal;

a plurality of digital filters which operate in series, each configured to receive the digital representation of the intermediate frequency signal and filter the digital representation of the signal at a frequency offset, each digital filter using a different frequency offset;

a plurality of correlators, each configured to receive a filtered digital representation of said signal from one of said plurality of digital filters and also configured to generate a correlation of the filtered digital representation of the signal to known synchronization words shifted by the frequency offset of the correlator's respective digital filter; and a selector configured to select one of the plurality of correlations and use the frequency offset of the correlator that generated the selected correlation to correct the digital representation of the intermediate frequency signal.

19. The frequency converter device of claim 18, wherein the selector is configured to select the frequency offset associated with the closest correlation.

20. A method for down-converting a radio frequency signal to an intermediate frequency signal in a receiver, said receiver comprising a limited-accuracy oscillator, said method comprising:

converting an analog signal received at a first frequency to a second frequency using an intermediate frequency generated by said limited-accuracy oscillator;

converting the analog signal to digital symbols;

filtering the digital symbols by a plurality of frequency offsets;

correlating the filtered digital symbols with a plurality of digital representation of frequency offset synchronization words to generate correlations associated with each digital representation;

deriving a final frequency offset from said correlations associated with each digital representation; and rotating the digital symbols by the final frequency offset to generate the intermediate frequency signal;

wherein the method operates in a first mode and a second mode, and wherein the step of filtering comprises filtering with a greater number of the plurality of frequency offsets in the first mode than in the second.

21. A method for down-converting a radio frequency signal to an intermediate frequency signal in a receiver, said receiver comprising a limited-accuracy oscillator, said method comprising:

converting an analog signal received at a first frequency to a second frequency using an intermediate frequency generated by said limited-accuracy oscillator;

converting the analog signal to digital symbols;

filtering the digital symbols by a plurality of frequency offsets;

correlating the filtered digital symbols with a plurality of digital representation of frequency offset synchronization words to generate correlations associated with each digital representation;

deriving a final frequency offset from said correlations associated with each digital representation, comprising non-linearly combining the correlations; and rotating the digital symbols by the final frequency offset to generate the intermediate frequency signal.

22. The method of claim 21, wherein the non-linear combining comprises quadration interpolation of the correlations.

23. A method for down-converting a radio frequency signal to an intermediate frequency signal in a receiver, said receiver comprising a limited-accuracy oscillator, said method comprising:

converting an analog signal received at a first frequency to a second frequency using an intermediate frequency generated by said limited-accuracy oscillator;

converting the analog signal to digital symbols;

serially filtering the digital symbols by a plurality of frequency offsets;

correlating the filtered digital symbols with a plurality of digital representation of frequency offset synchronization words to generate correlations associated with each digital representation;

deriving a final frequency offset from said correlations associated with each digital representation; and rotating the digital symbols by the final frequency offset to generate the intermediate frequency signal.

24. A method for down-converting a radio frequency signal to an intermediate frequency signal in a receiver, said receiver comprising a limited-accuracy oscillator, said method comprising:

converting an analog signal received at a first frequency to a second frequency using an intermediate frequency generated by said limited-accuracy oscillator;

converting the analog signal to digital symbols;

filtering the digital symbols by a plurality of frequency offsets;

serially correlating the filtered digital symbols with a plurality of digital representation of frequency offset synchronization words to generate correlations associated with each digital representation;

deriving a final frequency offset from said correlations associated with each digital representation; and rotating the digital symbols by the final frequency offset to generate the intermediate frequency signal.

25. A method for down-converting a radio frequency signal to an intermediate frequency signal in a receiver, said receiver comprising a limited-accuracy oscillator, said method comprising:

converting an analog signal received at a first frequency to a second frequency using an intermediate frequency generated by said limited-accuracy oscillator;

converting the analog signal to digital symbols;

filtering the digital symbols by a plurality of frequency offsets;

correlating the filtered digital symbols with a plurality of digital representation of frequency offset synchronization words to generate correlations associated with each digital representation;

deriving a final frequency offset from said correlations associated with each digital representation, comprising linearly combining the correlations; and rotating the digital symbols by the final frequency offset to generate the intermediate frequency signal.

26. The method of claim 25, wherein the linear combining comprises weighting selected ones of the correlations and then averaging the correlations.

27. The method of claim 25, further including the step of filtering the analog signal after converting the signal to the second frequency.

28. The method of claim 25, wherein the linear combining comprises averaging the correlations.

29. The method of claim 25, wherein said step of filtering occurs simultaneously.

30. The method of claim 25, wherein the step of correlating occurs simultaneously.

* * * * *